US012615976B2

(12) United States Patent
Li et al.

(10) Patent No.: US 12,615,976 B2
(45) Date of Patent: Apr. 28, 2026

(54) METHODS FOR DEPOSITING DIELECTRIC FILMS WITH INCREASED STABILITY

(71) Applicant: Applied Materials, Inc., Santa Clara, CA (US)

(72) Inventors: Wenhui Li, San Jose, CA (US); Bo Xie, San Jose, CA (US); Li-Qun Xia, Cupertino, CA (US); Prayudi Lianto, Singapore (SG); Shanshan Yao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 341 days.

(21) Appl. No.: 18/192,563

(22) Filed: Mar. 29, 2023

(65) Prior Publication Data

US 2024/0332005 A1      Oct. 3, 2024

(51) Int. Cl.
*H01L 21/02* (2006.01)

(52) U.S. Cl.
CPC .. *H01L 21/02211* (2013.01); *H01L 21/02167* (2013.01); *H01L 21/0234* (2013.01)

(58) Field of Classification Search
None
See application file for complete search history.

(56) References Cited

U.S. PATENT DOCUMENTS

| | | | |
|---|---|---|---|
| 11,142,462 B2 | 10/2021 | Hwang et al. | |
| 2004/0038514 A1* | 2/2004 | Hyodo | C23C 16/30 |
| | | | 438/623 |
| 2004/0175929 A1 | 9/2004 | Schmitt et al. | |
| 2014/0213070 A1 | 7/2014 | Hong et al. | |
| 2022/0044927 A1 | 2/2022 | Wang et al. | |
| 2024/0327973 A1* | 10/2024 | Kumar | C23C 16/24 |

FOREIGN PATENT DOCUMENTS

KR        20180002774 A        1/2018

OTHER PUBLICATIONS

International Search Report and Written Opinion for PCT/US2024/020540 mailed Jul. 17, 2024, 10 pages.
International Application No. PCT/US2024/020540, International Preliminary Report on Patentability mailed on Oct. 9, 2025, 7 pages.

* cited by examiner

*Primary Examiner* — Asok K Sarkar
(74) *Attorney, Agent, or Firm* — Kilpatrick Townsend & Stockton LLP

(57)        ABSTRACT

Embodiments include semiconductor processing methods to form dielectric films on semiconductor substrates are described. The methods may include providing a silicon-containing precursor and a nitrogen-containing precursor to a processing region of a semiconductor processing chamber. A substrate may be disposed within the processing region. The methods may include providing an inert precursor to the processing region of the semiconductor processing chamber. The methods may include generating plasma effluents of the silicon-containing precursor, the nitrogen-containing precursor, and the inert precursor. The methods may include depositing a silicon-containing material on the substrate.

20 Claims, 3 Drawing Sheets

METHODS FOR DEPOSITING DIELECTRIC FILMS WITH INCREASED STABILITY

TECHNICAL FIELD

The present technology relates to deposition methods. More specifically, the present technology relates to methods of low temperature deposition of dielectric films having increased stability.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments include semiconductor processing methods to form dielectric films on semiconductor substrates are described. The methods may include providing a silicon-containing precursor and a nitrogen-containing precursor to a processing region of a semiconductor processing chamber. A substrate may be disposed within the processing region. The methods may include providing an inert precursor to the processing region of the semiconductor processing chamber. The methods may include generating plasma effluents of the silicon-containing precursor, the nitrogen-containing precursor, and the inert precursor. The methods may include depositing a silicon-containing material on the substrate.

In embodiments, the silicon-containing precursor may be or include trimethylsilane (TMS). The nitrogen-containing precursor may be or include ammonia (NH$_3$). The inert precursor may be or include argon. A flow rate ratio of the inert precursor compared to the silicon-containing precursor may be greater than or about 3:1. The plasma effluents of the silicon-containing precursor, the nitrogen-containing precursor, and the inert precursor may be generated at a plasma power of greater than or about 250 W. The silicon-containing material may be characterized by a carbon content of greater than or about 20 at. %. The methods may include, subsequent to the depositing the silicon-containing material, performing a post-deposition plasma treatment on the silicon-containing material. The methods may include halting a flow of the silicon-containing precursor prior to performing the post-deposition plasma treatment on the silicon-containing material. The methods may include bonding the silicon-containing material on the substrate to an exposed silicon-and-carbon-containing material on a second substrate.

Some embodiments of the present technology may encompass semiconductor processing methods. The methods may include providing a silicon-containing precursor, a nitrogen-containing precursor, and argon to a processing region of a semiconductor processing chamber. A substrate may be disposed within the processing region. The methods may include generating plasma effluents of the silicon-containing precursor, the nitrogen-containing precursor, and argon. The methods may include depositing a silicon-containing material on the substrate. The silicon-containing material may be deposited at a rate of less than or about 5,000 Å/min.

In embodiments, a flow rate of argon may be greater than or about 1,000 sccm. A temperature within the semiconductor processing chamber may be maintained at less than or about 300° C. A pressure within the semiconductor processing chamber may be maintained at less than or about 10 Torr. The silicon-containing material may be characterized by an oxygen content of less than or about 2.0 at. %. Subsequent a period of aging, the oxygen content in the silicon-containing material may not increase above about 3.0 at. %. The silicon-containing material may be characterized by a Young's modulus of greater than or about 30 GPa, a hardness greater than or about 5 GPa, or both.

Some embodiments of the present technology may encompass semiconductor processing methods. The methods may include providing a silicon-containing precursor and a nitrogen-containing precursor to a processing region of a semiconductor processing chamber. A substrate may be disposed within the processing region. The silicon-containing precursor, the nitrogen-containing precursor, or both may include carbon. The methods may include providing an inert precursor to the processing region of the semiconductor processing chamber. The methods may include generating plasma effluents of the silicon-containing precursor, the nitrogen-containing precursor, and the inert precursor. The methods may include depositing a silicon-containing material on the substrate. The silicon-containing material may be characterized by a carbon content of greater than or about 20 at. %. The methods may include halting a flow rate of the silicon-containing precursor. The methods may include performing a post-deposition plasma treatment on the silicon-containing material.

In embodiments, the post-deposition plasma treatment may reduce the carbon content at an exposed surface of the silicon-containing material. A plasma power during the post-deposition plasma treatment may be maintained at less than or about 1,500 W.

Such technology may provide numerous benefits over conventional processing methods. For example, utilizing precursors at specific flow rate ratios may increase the carbon content in the deposited material. By increasing the carbon content, the deposited material may have higher bonding strength. Additionally, utilizing precursors at specific flow rate ratios, a denser material may be deposited that may be less prone to oxidation after deposition, which again may provide a deposited material with higher bonding strength. Further, the specific flow rate ratios, and increased inert precursor flow rate, may stabilize the deposited material at higher carbon contents. Additionally, post-deposition treatments may further increase the stability of the deposited material and make the material a better candidate for bonding applications. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
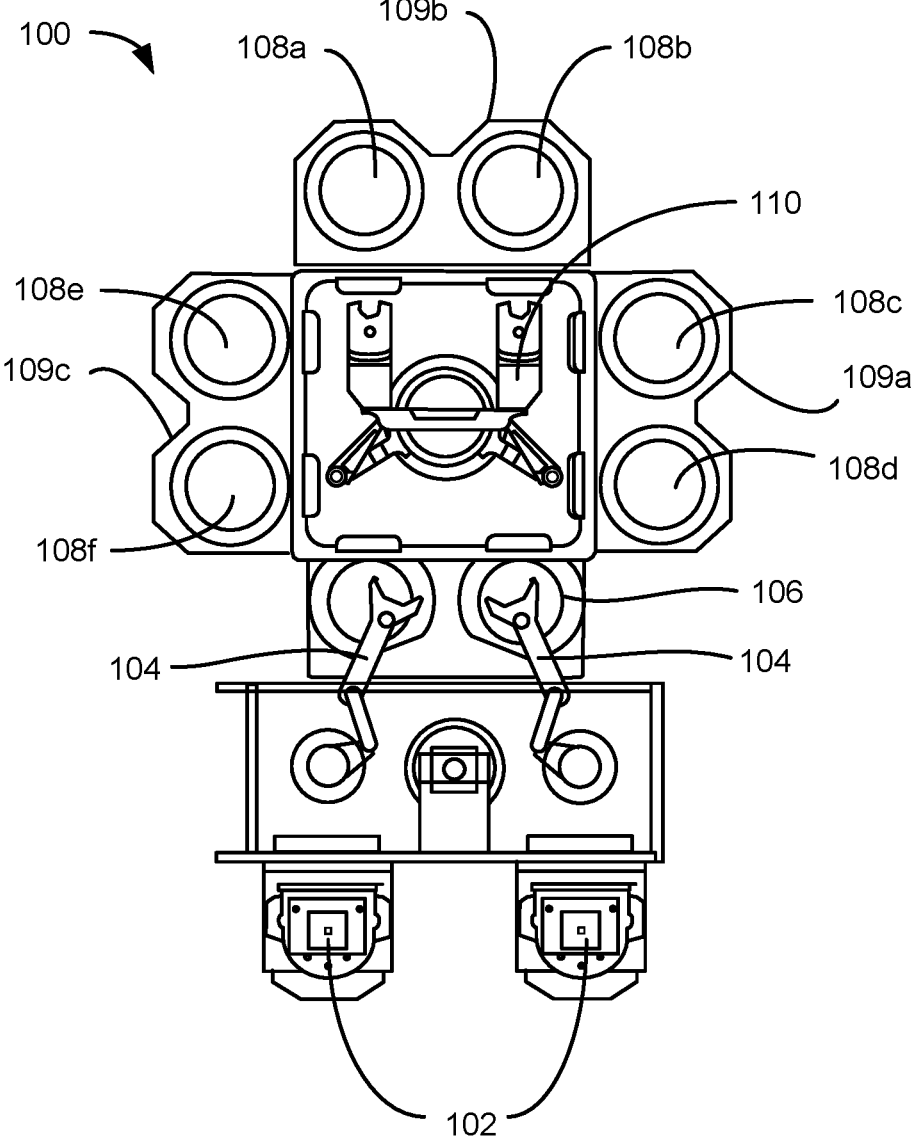
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line (BEOL) semiconductor processing, dielectric films may serve multiple functions in the fabrication of metallization layers in an integrated circuit. These functions may include the incorporation of electrically-insulating dielectric films between electrically-conductive metal-containing structures such as interconnect lines, contact holes, and vias, among other structures. These functions may also include adhering different substrates or wafers together, such as in wafer-to-wafer bonding.

Dielectric films used in BEOL processing, especially for wafer-to-wafer bonding or other hybrid bonding applications, should have increased carbon content and mechanical properties with resistivity to oxidation. Unfortunately, these qualities are often in tension in dielectric films made from a silicon-containing material. In many instances, a higher amount of carbon in the material may both lower the k value and reduce the film's mechanical stability, as well as increase the materials likelihood of oxidation after processing and prior to bonding.

In many conventional technologies, thermal budgets may limit the temperature at which the dielectric films may be deposited. At lower temperatures, film quality typically suffers, with carbon content and other mechanical properties decreasing in addition to the films being more susceptible to oxidation. One approach to improving the mechanical stability of dielectric films is to densify the film during deposition. However, densification efforts may cause carbon depletion in the films, leading to worse bonding energies. In order to combat carbon depletion, conventional technologies have pushed the temperature at which the dielectric films may be deposited, but are nonetheless limited by thermal budgets due to other materials. Additionally, exposed surfaces of conventional dielectric films are prone to oxidation during aging.

The present technology may overcome these issues by including embodiments of semiconductor processing methods that form dielectric films with desired mechanical characteristics and increased stability. In embodiments, these dielectric films may be characterized by increased carbon content and desirable mechanical properties while simultaneously being less prone to oxidation during aging periods. By performing deposition at lower temperature with particular precursors and flow rate ratios, densified dielectric films with increased carbon content may be deposited. Additionally, the present technology may include post-deposition treatments to further reduce susceptibility to oxidation. This may overcome the natural tendency of increased carbon content to result in a film more susceptible to oxidation.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
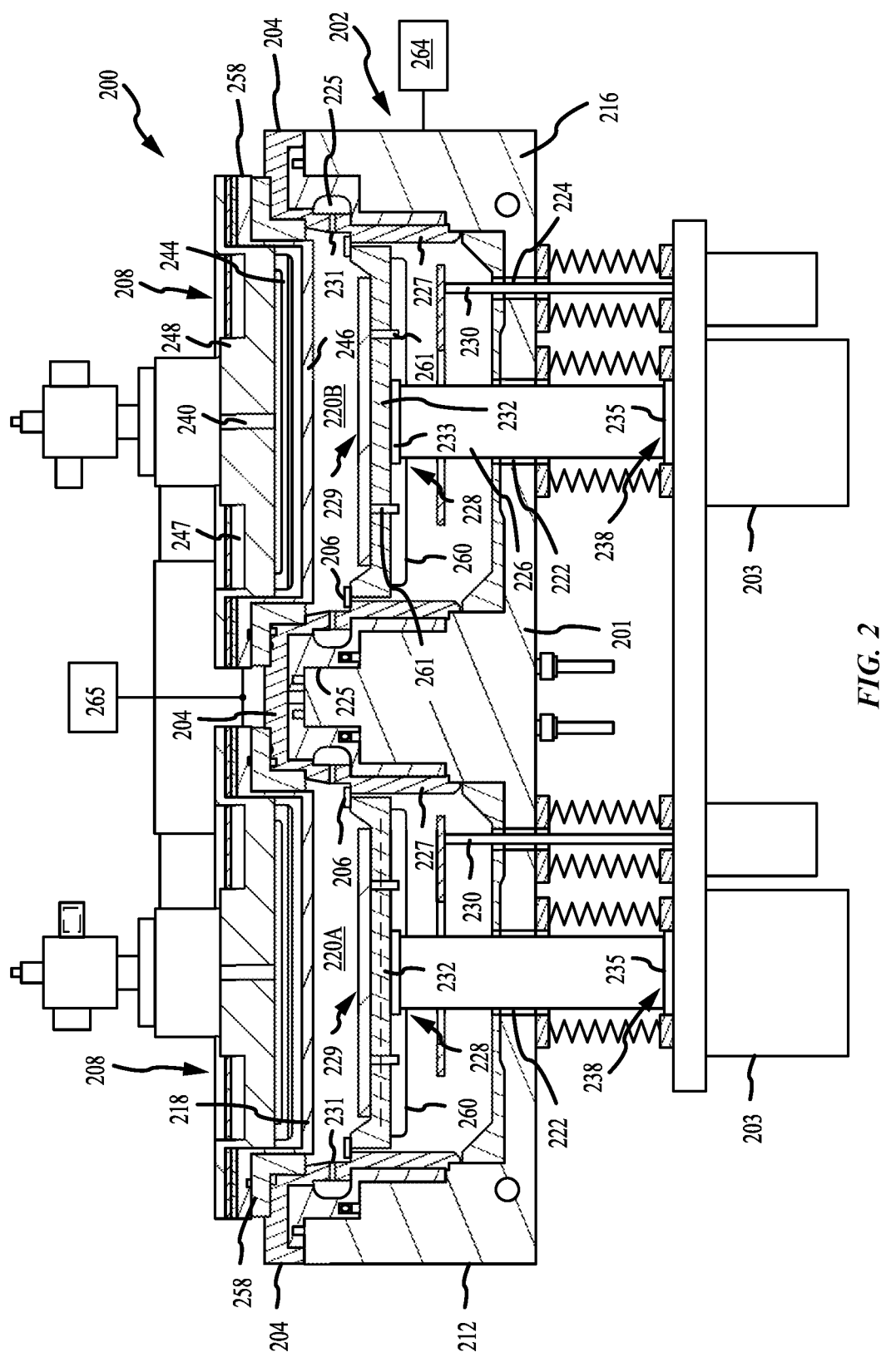
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
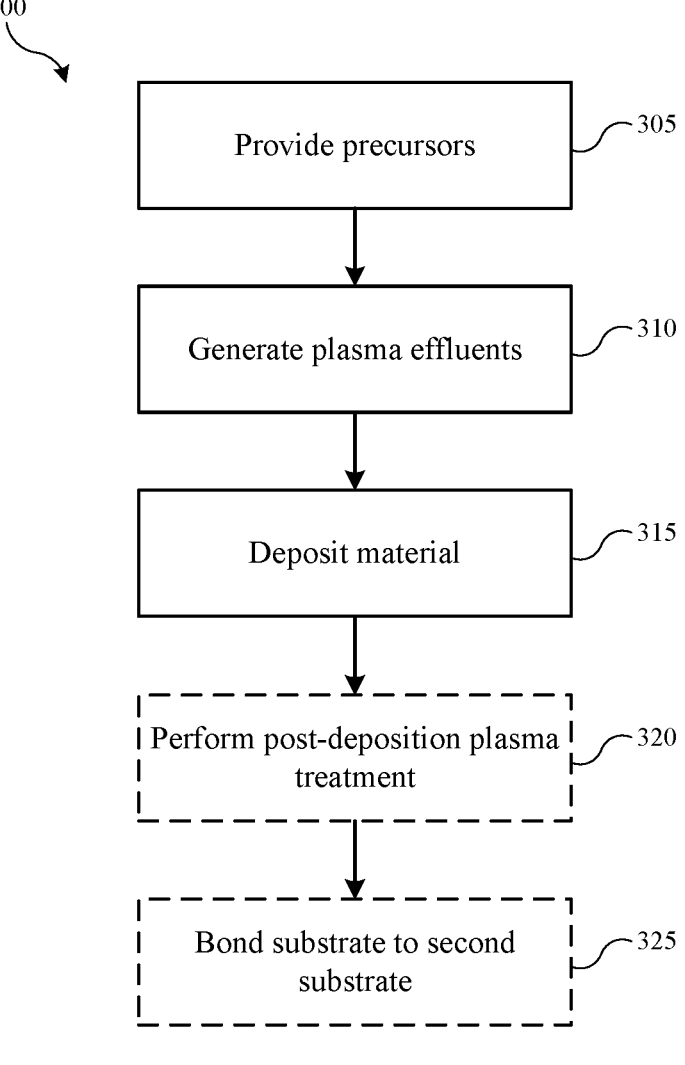
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as one of processing chambers 108a-f described above, or other chambers that may include components as described above. The substrate may be deposited on a substrate support, which may be a pedestal such as pedestal 228, and which may reside in a processing region of the chamber, such as processing region 220A or 220B described above.

The substrate may be any number of materials on which deposition may be performed. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, may be adsorbed, reacted, or formed on a surface of the substrate.

Additionally, material removal may be performed, such as reduction of native oxides or etching of material, or any other operation that may prepare one or more exposed surfaces of the substrate for deposition.

At operation 305, one or more precursors may be provided to the processing region of the semiconductor processing chamber. For example, in embodiments in which a silicon-containing material may be formed, a silicon-containing precursor may be delivered to the processing region of the processing chamber. In embodiments in which a silicon-and-nitrogen-containing material may be formed, a nitrogen-containing precursor may be provided with the silicon-containing precursor. However, it is also contemplated that a single precursor, such as a silicon-and-nitrogen-containing precursor may alternatively or additionally be provided. Plasma enhanced deposition may be performed in some embodiments of the present technology, which may facilitate material reactions and deposition. Along with the silicon-containing precursor and/or nitrogen-containing precursor, one or more inert precursors, such as argon, helium, or any other inert gases, may be provided to the processing region of the semiconductor processing chamber.

The precursors provided to the processing region may all be used to form a plasma within the processing region of the semiconductor processing chamber at operation 310. For example. In embodiments, method 300 may include generating plasma effluents of the silicon-containing precursor, the nitrogen-containing precursor, and the inert precursor at operation 310. At operation 315, a silicon-containing material may be deposited on the substrate. As further discussed below, the present technology may afford deposition of silicon-containing material characterized by desired properties, such as dielectric with increased stability, such as reduced susceptibility to oxidation. In embodiments, a post-deposition plasma treatment may be performed at optional operation 320 subsequent to depositing the silicon-containing material to further increase the properties and/or stability of the silicon-containing material. Additionally, method 300 may include bonding the silicon-containing material on the substrate to an exposed silicon-and-carbon-containing material on a second substrate.

Any number of precursors may be used with the present technology with regard to the silicon-containing precursor. For example, the silicon-containing precursor may include any silicon-containing material, such as silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS), or any other silicon-containing material useful in semiconductor processing. The nitrogen-containing precursor may be any nitrogen-containing material, such as nitrous oxide ($N_2O$), nitrogen dioxide ($NO_2$), ammonia ($NH_3$), diazene ($N_2H_2$), or any other nitrogen-containing material useful in semiconductor processing. In embodiments, the silicon-containing precursor, the nitrogen-containing precursor, or both may include carbon. The inert precursor may include one or more noble gases, including argon or helium as noted above, or other gases that may have limited interaction or may not be incorporated within the material deposited.

Depending on the precursors used, the silicon-containing precursor may be provided at a flow rate less than or about 2,000 sccm, and may be provided at a flow rate less than or about 1,750 sccm, less than or about 1,500 sccm, less than or about 1,250 sccm, less than or about 1,000 sccm, less than or about 950 sccm, less than or about 900 sccm, less than or about 850 sccm, less than or about 800 sccm, 750 sccm, less than or about 700 sccm, less than or about 650 sccm, less than or about 600 sccm, less than or about 550 sccm, less than or about 500 sccm, less than or about 450 sccm, less than or about 400 sccm, or less. Similarly, the nitrogen-containing precursor may be provided at a flow rate less than or about 3,000 sccm, and may be provided at a flow rate less than or about 2,500 sccm, less than or about 2,000 sccm, less than or about 1,750 sccm, less than or about 1,500 sccm, less than or about 1,250 sccm, less than or about 1,000 sccm, less than or about 800 sccm, less than or about 600 sccm, less than or about 500 sccm, less than or about 450 sccm, less than or about 400 sccm, or less. Any additional ranges within these ranges or as combinations of any stated or unstated number may also be used.

The inert precursor may be provided at greater than or about 500 sccm, and may be provided at a flow rate of greater than or about 750 sccm, greater than or about 1,000 sccm, greater than or about 1,250 sccm, greater than or about 1,500 sccm, greater than or about 1,750 sccm, greater than or about 2,000 sccm, greater than or about 2,250 sccm, greater than or about 2,500 sccm, greater than or about 2,750 sccm, greater than or about 3,000 sccm, greater than or about 3,250 sccm, greater than or about 3,500 sccm, greater than or about 3,750 sccm, greater than or about 4,000 sccm, or more. Increasing the inert precursor may increase plasma density and ion bombardment during deposition of the silicon-containing material. The increased plasma density and ion bombardment may result in a densified silicon-containing material being deposited that may be characterized by increased carbon content, which may be less prone to oxidation compared to conventional materials with similar carbon content. The inert precursor, such as argon, may result in lower hydrogen presence in the deposited material due to hydrogen outgassing during the deposition, which may reduce the potential for oxidation.

In embodiments, a flow rate ratio of the inert precursor compared to the silicon-containing precursor may be greater than or about 3:1. By maintaining the flow rate ratio of the inert precursor compared to the silicon-containing precursor at greater than or about 3:1, a deposition rate of the silicon-containing material may be reduced. At reduced deposition rates, the inert precursor may further densify the material being deposited as the inert precursor may be able to interact with the deposited material for an extended period of time during deposition. Accordingly, in embodiments, the flow rate ratio of the inert precursor compared to the silicon-containing precursor may be greater than or about 3:1, and may be maintained at greater than or about 4:1, greater than or about 5:1, greater than or about 6:1, greater than or about 7:1, greater than or about 8:1, greater than or about 9:1, greater than or about 10:1, or higher.

One or more additional aspects of the method 300 may also be tuned to improve aspects of the deposition being performed. For example, the plasma power may impact the extent of precursor dissociation. Accordingly, lower plasma power may decrease the deposition rate of the silicon-containing material. However, at lower plasma power, the carbon incorporation in the deposited material may decrease. Accordingly, in some embodiments the plasma effluents may be generated at a plasma power of greater than or about 200 W, and may be greater than or about 250 W, greater than or about 300 W, greater than or about 350 W, greater than or about 400 W, greater than or about 450 W, greater than or about 500 W, greater than or about 600 W, greater than or about 700 W, greater than or about 800 W, greater than or about 900 W, greater than or about 1,000 W, or more. However, to limit the deposition rate in embodiments, plasma effluents may be generated at less than or about 1,000 W, and may be generated at less than or about 900 W, less than or about 800 W, less than or about 700 W, less than or about 600 W, less than or about 500 W, or less.

In embodiments of the present technology, the deposition may be performed at substrate, pedestal, and/or chamber temperatures greater than or about 50° C., and may be performed at temperatures greater than or about 100° C. greater than or about 150° C., greater than or about 200° C., greater than or about 300° C., or higher. The temperature may also be maintained at any temperature within these ranges, within smaller ranges encompassed by these ranges, or between any of these ranges. In some embodiments the method may be performed on substrates that may have a number of produced features, which may produce a thermal budget. Accordingly, in some embodiments, the methods may be performed at temperatures less than or about 350° C., and may be performed at temperatures less than or about 300° C., less than or about 275° C., less than or about 250° C., less than or about 225° C., less than or about 200° C., or lower. The temperature may also be maintained at any temperature within these ranges, within smaller ranges encompassed by these ranges, or between any of these ranges.

The pressure within the processing region may affect the amount of ionization and physical interaction performed during the deposition. By lowering a processing pressure, increased ion interaction may occur. Accordingly, in some embodiments a processing pressure during the deposition may be maintained at less than or about 20 Torr, and may be maintained at less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less.

By tuning the flow rate ratio of the inert precursor compared to the silicon-containing precursor, the plasma power, or any other process characteristics, the silicon-containing material may be deposited at a rate of less than or about 5,000 Å/min. At noted above, lower deposition rates may allow for increased interaction between the silicon-containing material being deposited and the inert precursor to provide a more stable material. Accordingly, the silicon-containing material may be deposited at a rate of less than or about 5,000 Å/min, and may be deposited at a rate of less than or about 4,750 Å/min, less than or about 4,500 Å/min, less than or about 4,250 Å/min, less than or about 4,000 Å/min, less than or about 3,750 Å/min, less than or about 3,500 Å/min, less than or about 3,250 Å/min, less than or about 3,000 Å/min, less than or about 2,750 Å/min, less than or about 2,500 Å/min, less than or about 2,250 Å/min, less than or about 2,000 Å/min, less than or about 1,750 Å/min, less than or about 1,500 Å/min, or less.

Additionally, by maintaining a reduced spacing between the substrate and the showerhead, increased inert precursor ion bombardment may be achieved. The increased ion bombardment, as previously discussed, may densify the material and may reduce the likelihood of subsequent oxidation after processing. In embodiments, the spacing between the substrate and the showerhead may be maintained at less than or about 450 mil, and may be maintained at less than or about 425 mil, less than or about 400 mil, less than or about 380 mil, less than or about 360 mil, less than or about 340 mil, less than or about 320 mil, less than or about 300 mil, less than or about 280 mil, less than or about 260 mil, or less.

As noted above, method 300 may include performing a post-deposition plasma treatment on the silicon-containing material at optional operation 320. Performing the post-deposition plasma treatment on the silicon-containing material may include halting the flow rate of the silicon-containing precursor. However, flow rates of the other precursors, such as the nitrogen-containing precursor and the inert precursor, which may include both argon and helium, may be maintained. The post-deposition plasma treatment may reduce the carbon content at an exposed surface of the silicon-containing material. By performing the post-deposition treatment with maintained flow rates of the nitrogen-containing precursor and/or the inert precursors, an exposed surface of the silicon-containing material may be further densified to protect the silicon-containing material form unwanted oxidation by preventing potential oxygen penetration.

During the post-deposition plasma treatment, operating conditions may be maintained relative to the deposition at operation 315, and may be maintained at any level previously discussed. However, it is contemplated that in some embodiments, plasma power, temperature, or pressure may be adjusted during the post-deposition plasma treatment. For example, the plasma power may be increased from a first plasma power level during the deposition at operation 315 to a second plasma power level during the post-deposition plasma treatment at optional operation 320. For example, the deposition at operation 315 may be performed at a plasma power of about 500 W, and the post-deposition plasma treatment at optional operation 320 may be performed at less than or about 1,500 W.

For continued processing, a planarization operation, such as chemical mechanical planarization, may expose the underlying high carbon content material. For example, the underlying high carbon content material may be exposed prior to bonding the silicon-containing material on the substrate to an exposed silicon-and-carbon-containing material on the second substrate at optional operation 325 as previously noted. Due to the stability of the silicon-containing material provided by the present technology increased bonding strength may result with the exposed silicon-and-carbon-containing material on the second substrate. Depending on the exposed silicon-and-carbon-containing material on the second substrate, the bonding strength between the two substrates may be greater than or about 1 $J/m^2$, and may be greater than or about 1.1 $J/m^2$, greater than or about 1.2 $J/m^2$, greater than or about 1.3 $J/m^2$, greater than or about 1.4 $J/m^2$, greater than or about 1.5 $J/m^2$, greater than or about 1.6 $J/m^2$, greater than or about 1.7 $J/m^2$, greater than or about 1.8 $J/m^2$, greater than or about 1.9 $J/m^2$, greater than or about 2.0 $J/m^2$, greater than or about 2.2 $J/m^2$, greater than or about 2.4 $J/m^2$, greater than or about 2.6 $J/m^2$, greater than or about 2.8 $J/m^2$, greater than or about 3.0 $J/m^2$, or more. The increased bonding strength between the two substrates compared to conventional technologies may be due to the increased carbon content and overall stability of the silicon-containing material afforded by the present technology.

In embodiments of the present technology, the silicon-containing material may be characterized by a carbon content of greater than or about 20 at. %. Increased carbon content may better suit the silicon-containing material for bonding applications, such as wafer-to-wafer bonding, due to the increased bonding energy or strength. Accordingly, the silicon-containing material of the present technology may be characterized by a carbon content of greater than or about 20 at. %, and may be characterized by a carbon content of greater than or about 20 at. %, greater than or about 22 at. %, greater than or about 24 at. %, greater than or about 26 at. %, greater than or about 28 at. %, greater than or about 30 at. %, greater than or about 32 at. %, greater than or about 34 at. %, greater than or about 36 at. %, greater than or about 38 at. %, greater than or about 40 at. %, greater than or about 42 at. %, greater than or about 44 at. %, greater than or about 46 at. %, greater than or about 48 at. %, greater than or about 50 at. %, or higher. Additionally, due to characteristics of the deposition, the silicon-containing material may be less prone to oxidation during aging without sacrificing carbon content in the material.

Similarly, the silicon-containing material may be characterized by an oxygen content of less than or about 3.0 at. %, and may be maintained at less than or about 2.8 at. %, less than or about 2.6 at. %, less than or about 2.4 at. %, less than or about 2.2 at. %, less than or about 2.0 at. %, less than or about 1.8 at. %, less than or about 1.6 at. %, less than or about 1.4 at. %, less than or about 1.2 at. %, less than or about 1.0 at. %, less than or about 0.8 at. %, less than or about 0.6 at. %, less than or about 0.4 at. %, less than or about 0.2 at. %, or less. The present technology, through the deposition characteristics and/or the post-deposition plasma treatment, may produce silicon-containing material that is highly resistant to oxygen penetration and/or oxidation. In embodiments, subsequent a period of aging, the oxygen content in the silicon-containing material may not increase above about 3.0 at. %, and may not increase above about 2.8 at. %, above about 2.6 at. %, above about 2.4 at. %, above about 2.2 at. %, above about 2.0 at. %, above about 1.8 at. %, above about 1.6 at. %, above about 1.4 at. %, above about 1.2 at. %, above about 1.0 at. %, or less.

As explained above, the processing methods of the present technology may include embodiments that utilize deposition precursors and processing conditions that form dielectric films having a low dielectric constant and high mechanical stability. In embodiments of processing method 300, as-deposited dielectric films may be formed as silicon-carbon-and-nitrogen-containing films with dielectric constants less than or about 6.0, less than or about 5.9, less than or about 5.8, less than or about 5.7, less than or about 5.6, less than or about 5.5, less than or about 5.4, less than or about 5.3, less than or about 5.2, less than or about 5.1, less than or about 5.0, less than or about 4.9, less than or about 4.8, less than or about 4.7, less than or about 4.6, less than or about 4.5, or less.

The processing methods of the present technology include embodiments that produce as-deposited dielectric films that are characterized by a high mechanical stability. In embodiments, the as-deposited dielectric films may be characterized by a Young's modulus of greater than or about 30 GPa, and may be characterized by a Young's modulus of greater than or about 35 GPa, greater than or about 40 GPa, greater than or about 45 GPa, greater than or about 50 GPa, greater than or about 55 GPa, greater than or about 60 GPa, or higher. In further embodiments, the as-deposited dielectric films may be characterized by a hardness of greater than or about 4 GPa, and may be characterized by a hardness of greater than or about 4.5 GPa, greater than or about 5.0 GPa, greater than or about 5.5 GPa, greater than or about 6.0 GPa, greater than or about 6.5 GPa, or higher. These and other embodiments of the present technology provide a path to forming as-deposited dielectric films from silicon-containing plasma effluents with high carbon content, low dielectric constants, and higher Young's moduli and harnesses that can be produced with increased carbon contents suitable for necessary applications, such as, but not limited to, hybrid packaging of semiconductor devices. Additionally, the present technology may produce materials less susceptible to oxygen penetration and oxidation.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a silicon-containing precursor, a nitrogen-containing precursor, and an inert gas to a processing region of a semiconductor processing chamber, wherein a substrate is disposed within the processing region;
   generating plasma effluents of the silicon-containing precursor, the nitrogen-containing precursor, and the inert gas; and
   depositing a silicon-containing material on the substrate.

2. The semiconductor processing method of claim 1, wherein the silicon-containing precursor comprises trimethylsilane (TMS).

3. The semiconductor processing method of claim 1, wherein the nitrogen-containing precursor comprises ammonia ($NH_3$).

4. The semiconductor processing method of claim 1, wherein the inert gas comprises argon.

5. The semiconductor processing method of claim 1, wherein a flow rate ratio of the inert gas compared to the silicon-containing precursor is greater than or about 3:1.

6. The semiconductor processing method of claim 1, wherein the plasma effluents of the silicon-containing precursor, the nitrogen-containing precursor, and the inert gas are generated at a plasma power of greater than or about 250 W.

7. The semiconductor processing method of claim 1, wherein the silicon-containing material is characterized by a carbon content of greater than or about 20 at. %.

8. The semiconductor processing method of claim 1, further comprising:

subsequent to the depositing the silicon-containing material, performing a post-deposition plasma treatment on the silicon-containing material.

9. The semiconductor processing method of claim 8, further comprising:

halting a flow of the silicon-containing precursor prior to performing the post-deposition plasma treatment on the silicon-containing material.

10. The semiconductor processing method of claim 8, further comprising:

bonding the silicon-containing material on the substrate to an exposed silicon-and-carbon-containing material on a second substrate.

11. A semiconductor processing method comprising:

providing a silicon-containing precursor, a nitrogen-containing precursor, and argon to a processing region of a semiconductor processing chamber, wherein a substrate is disposed within the processing region;

generating plasma effluents of the silicon-containing precursor, the nitrogen-containing precursor, and argon; and depositing a silicon-carbon-and-nitrogen-containing material on the substrate, wherein the silicon-carbon-and-nitrogen-containing material is deposited at a rate of less than or about 5,000 Å/min.

12. The semiconductor processing method of claim 11, wherein a flow rate of argon is greater than or about 1,000 sccm.

13. The semiconductor processing method of claim 11, wherein a temperature within the semiconductor processing chamber is maintained at less than or about 300° C.

14. The semiconductor processing method of claim 11, wherein a pressure within the semiconductor processing chamber is maintained at less than or about 10 Torr.

15. The semiconductor processing method of claim 11, wherein the silicon-carbon-and-nitrogen-containing material is characterized by an oxygen content of less than or about 2.0 at. %.

16. The semiconductor processing method of claim 15, wherein, subsequent a period of aging, the oxygen content in the silicon-carbon-and-nitrogen-containing material does not increase above about 3.0 at. %.

17. The semiconductor processing method of claim 11, wherein the silicon-carbon-and-nitrogen-containing material is characterized by a Young's modulus of greater than or about 30 GPa, a hardness greater than or about 5 GPa, or both.

18. A semiconductor processing method comprising:

providing a silicon-containing precursor, a nitrogen-containing precursor, and an inert gas to a processing region of a semiconductor processing chamber, wherein a substrate is disposed within the processing region, and wherein the silicon-containing precursor, the nitrogen-containing precursor, or both comprise carbon;

generating plasma effluents of the silicon-containing precursor, the nitrogen-containing precursor, and the inert gas;

depositing a silicon-containing material on the substrate, wherein the silicon-containing material is characterized by a carbon content of greater than 30 at. %;

halting a flow rate of the silicon-containing precursor; and performing a post-deposition plasma treatment on the silicon-containing material.

19. The semiconductor processing method of claim 18, wherein the post-deposition plasma treatment reduces the carbon content at an exposed surface of the silicon-containing material.

20. The semiconductor processing method of claim 18, wherein a plasma power during the post-deposition plasma treatment is maintained at less than or about 1,500 W.

* * * * *